United States Patent [19]
Zheng

[11] Patent Number: 5,875,144
[45] Date of Patent: *Feb. 23, 1999

[54] SHARED PULL-UP AND SELECTION CIRCUITRY FOR PROGRAMMABLE CELLS SUCH AS ANTIFUSE CELLS

[75] Inventor: Hua Zheng, Boise, Id.

[73] Assignee: Micron Technology, Inc., Boise, Id.

[*] Notice: The term of this patent shall not extend beyond the expiration date of Pat. No. 5,734,617.

[21] Appl. No.: 915,075

[22] Filed: Aug. 20, 1997

Related U.S. Application Data

[63] Continuation of Ser. No. 690,755, Aug. 1, 1996.

[51] Int. Cl.$^6$ .................................................. G11C 8/00
[52] U.S. Cl. ........................................ 365/225.7; 365/100
[58] Field of Search ................................ 365/225.7, 100, 365/148, 96

[56] References Cited

U.S. PATENT DOCUMENTS

| | | | |
|---|---|---|---|
| 4,689,494 | 8/1987 | Chen et al. | 307/202.1 |
| 4,714,839 | 12/1987 | Chung | 307/441 |
| 4,720,817 | 1/1988 | Childers | 365/200 |
| 5,412,593 | 5/1995 | Magel et al. | 365/96 |
| 5,442,589 | 8/1995 | Kowalski | 365/225.7 |
| 5,448,187 | 9/1995 | Kowalski | 326/81 |
| 5,495,436 | 2/1996 | Callahan | 365/96 |
| 5,526,312 | 6/1996 | Eltoukhy | 365/201 |
| 5,572,458 | 11/1996 | Smith et al. | 365/96 |
| 5,572,476 | 11/1996 | Eltoukhy | 365/225.7 |
| 5,734,617 | 3/1998 | Zheng | 365/225.7 |

*Primary Examiner*—David Nelms
*Assistant Examiner*—M. Tran
*Attorney, Agent, or Firm*—Seed and Berry LLP

[57] ABSTRACT

A single pull-up circuit is shared between a redundant row antifuse cell, and a redundant column antifuse cell. Additionally, a single selection circuit is shared between the two antifuse cells. A row selection signal supplied thereto selects the antifuse cell for the redundant row, while a column selection signal selects the antifuse cell for the redundant column. A small channel length transistor is employed within the latch circuit. As a result, the latch can quickly pull up a value when the antifuse cell is not blown, and quickly latch that value within the latch since an RC time constant of the latch is decreased. A pulsed pull-up signal having a very short duration is employed to enable the latch. Since the pulsed pull-up signal has a short duration, a high voltage supply $V_{CC}$ is provided through the latch and a blown antifuse cell to ground for only a short duration, thereby minimizing the possibility of such a low resistance current path from damaging the circuitry. A transistor having a large channel resistance, however, is placed within a feedback path of the latch. Therefore, after the latch is set, if the antifuse cell is blown, the high resistance transistor provides a resistive current path from the $V_{CC}$ to ground.

17 Claims, 5 Drawing Sheets

SHARED PULL-UP AND SELECTION CIRCUITRY FOR PROGRAMMABLE CELLS SUCH AS ANTIFUSE CELLS

CROSS-REFERENCE TO RELATED APPLICATION

This application is a continuation of U.S. patent application Ser. No. 08/690,755, filed Aug. 1, 1996.

TECHNICAL FIELD

The present invention relates to antifuse circuits in integrated circuit devices.

BACKGROUND OF THE INVENTION

Typical integrated memory circuits include arrays of memory cells arranged in rows and columns. In most memory arrays, several redundant rows and columns are provided, which substitute for defective memory cells. When testing circuitry that tests the array identifies a defective memory cell, rather than treating the entire array as defective, a redundant row or column is substituted for the row or column having the defective memory cell (i.e., for the "defective" row or column). This substitution is performed by assigning the address of the defective row or column to tie redundant row or column such that, when an address signal corresponding to the defective row or column is received, the redundant row or column is addressed instead.

To make substitution of the redundant row or column substantially transparent to a system employing the memory circuit, the memory circuit includes ail address detection circuit. The address detection circuit monitors the row and column addresses received from the system employing the memory circuit. When the address detection circuit receives the address of a defective row or column, it enables the redundant row or column instead.

One type of address detection circuit is a fuse-bank address detection circuit. Fuse-bank address detection circuits employ a bank of sense lines where each sense line corresponds to a bit of an address word. The sense lines are programmed by blowing fuses in the sense lines in a pattern corresponding to the address word of the defective row or column. The programmed addresses are then detected by first applying a test voltage across the bank of sense lines. Then, bits of an external address are applied to the sense lines. If the pattern of blown fuses corresponds exactly to the pattern of external address bits, the sense lines all block current and the voltage across the bank remains high. Otherwise, at least one sense line conducts and the voltage falls. A high voltage thus indicates the programmed address matches the external address. A low voltage indicates a different external address has been applied.

Typically, the fuses are blown by cutting the fuse conductors with a laser to remove the conductive paths through the fuses. One problem with such an approach is that laser cutting of the fuses is time consuming, difficult, and imprecise. As a consequence, the cost and reliability of memory devices employing fuse bank circuits can be less than satisfactory.

To eliminate the cost, difficulty, and expense of laser cutting, memory devices have recently been developed that employ antifuses in place of conventional fuses. Antifuses are capacitive-type structures that, in their unblown states, form open circuits. Antifuses may be "blown" by applying a high voltage across the antifuse. The high voltage causes the capacitive-type structure to break down, forming a conductive path through the antifuse. Therefore, blown antifuses conduct and unblown antifuses do not conduct.

FIG. 1 shows a typical prior art antifuse circuit 46 from an antifuse bank in greater detail. As noted above, each redundant row and column is addressable by a single programmed address. Therefore, each antifuse bank must correspond to one redundant row or column. If a given memory cell is addressable by an eight bit address word, then eight of such antifuse circuits 46 will together form an antifuse bank. Typically, each antifuse bank will contain an array of antifuses for a redundant row, and an array of antifuses for a redundant column. The antifuse circuit 46 of FIG. 1 shows only one of several antifuse circuits within an antifuse bank that store addresses for both a redundant row and a redundant column. Each of the antifuse circuits 46 in an antifuse bank therefore is identical except for the blown or unblown state of row and column antifuses 48R and 48C, respectively, in each. Consequently, the following description applies equally to all of the antifuse circuits 46 in the antifuse bank.

The antifuse circuit 46 receives three principal input signals: an initiation signal T(RAS), a device enable signal DVC2E, and a reset signal RST. The T(RAS) signal is a delayed version of the row address select signal RAS, which is a common on-chip signal in many memory devices. Like the row address select signal RAS, the T(RAS) signal is a low-true signal. The device enable signal DVC2E is a conventional, on-chip signal at approximately half of the supply voltage $V_{CC}$, while the reset signal RST is an externally generated signal that resets the antifuse circuit 46 to the appropriate initial conditions.

In addition to the input signals T(RAS), DVC2E and RST, the antifuse circuit 46 also receives a switchable signal CGND at a switchable node 50. During normal operation, the switchable signal CGND is set to ground to provide a reference for checking the state of the antifuses 48R and 48C. For blowing the antifuses 48R, 48C, the switchable signal CGND is a high voltage, typically greater than 10 volts.

The antifuse circuit 46 includes four principal portions, a row output latch 52R, a row latch control circuit 53, a column output latch 52C and a column latch control circuit 53C. In general, elements in FIG. 1 having a "R" designation following the reference numeral indicates a circuit element for the row portion of the antifuse bank, while a "C" following the reference numeral corresponds to the column portion. While only the row output latch 52R and row latch control circuit 53R are described, such description applies equally to the operation of the column output latch 52C and the column latch control circuit 53C.

The row latch 52R is formed from three PMOS transistors 56R, 58R, 60R and an inverter 62R. The first and second transistors 56R, 58R are coupled in parallel with their sources coupled to the supply voltage $V_{CC}$ and their drains coupled at a node 64R. The gate of the first transistor 56R is controlled by the T(RAS) signal and the gate of the second transistor 58R is controlled by the output of the inverter 62R, which is also inverted again by an inverter 63R to become the output signal FR of the antifuse circuit 46. In this configuration, if either the T(RAS) signal or the output of the inverter 62R is low, the node 64R will be coupled to the supply voltage $V_{CC}$ through the first or second transistor 56R, 58R, respectively. The third transistor's gate is grounded so that the third transistor 60R is always on. Therefore, the third transistor 60R couples the node 64R to the inverter input. The third transistor 60R has a high channel length-to-width ratio so that it has a high channel resistance, typically about 300 kΩ or more. The third transistor 60R thus forms a constant, high resistance path between the node 64R and the input to the inverter 62R.

Ignoring the effect of the latch control section 53R, operation of the latch 52R is controlled by the T(RAS) signal. Initially, the output signal FR from the row latch 52R is low. Consequently, the gate of the second transistor 58R will be high such that the second transistor 58R is off. Initially, the T(RAS) signal is also high, so the first transistor 56R is off, isolating the node 64R from the supply voltage $V_{CC}$. The voltage at the node 64R will be low, because the latch control section 53R forms a path for current to bleed to ground, as described below. The third transistor 60R couples the voltage at node 64R to the inverter 62R so that the input voltage of the inverter is low. The inverter 62R thus continues to supply a high voltage to the gate of the second transistor 58R, keeping the second transistor off and maintaining the initial conditions.

After the initial conditions are established, the T(RAS) signal goes low, turning on the first transistor 56R. In response, supply voltage $V_{CC}$ pulls the voltage at node 64R high, through the first transistor 56R. The third transistor 60R transmits the high voltage at node 64R to the input of the inverter 62R. In response, the inverters 62R, 63R set the output signal FR high, thereby turning on the second transistor 58R. At this point, both the first and second transistors 56R, 58R are on.

Later (after address detection is complete), the T(RAS) signal returns high, turning off the first transistor 56R. However, the voltage at node 64R remains high, because the second transistor 58R is latched on through the inverter 62R since the input voltage to the inverter 62R is high and the inverter 62R keeps the second transistor 58R on. The output signal FR thus remains high, even after the T(RAS) signal returns high.

The row latch control circuit 53R is formed from a control transistor 66R and three current legs, all joined at a control node 68R. During normal operation, the control transistor 66R is turned on by the device enable signal DVC2E to couple the control node 68R to the input of the inverter 62R. The inverter's input voltage can therefore be controlled by a control voltage at the control node 68R.

The control voltage is controlled by one or more of the three current legs. The first or reset leg establishes the initial conditions of the row latch 52R. The reset leg is formed from an NMOS reset transistor 76R coupled between the control node 68R and ground. The reset signal RST drives the gate of the reset transistor 76R, such that when the reset signal RST is high, the reset transistor connects the control node 68R to ground. When the reset leg pulls the inverter input low, it forces the output signal FR to go low. This turns off the second transistor 58R. The T(RAS) signal is also high, because the initial conditions are established when address detection is inactive. Therefore, the first transistor 56R is also off. With both the first and second transistors 56R, 58R off, the voltage at the node 64R is pulled low. The row latch 52R is thus forced into the stable state described above with the output signal FR low, and the row latch remains set even after the reset signal RST is removed.

The second or reference leg forms a self-decoupling current path for blowing the antifuse 48R. The reference leg includes a pass NMOS transistor 78R and a decoupling NMOS transistor 80, serially coupled between the control node 68 and ground. The pass transistor 78R is controlled by a row address signal RAx which represents a bit of an address. The address signal RAx is active when the T(RAS) signal is active, such that the pass transistor 78R conducts when RAx is high (inactive) and blocks current when RAx is low (active). If the address signal RAx is low, the pass transistor 78R deactivates the reference leg so that it does not affect the response of the row latch 52R.

The decoupling transistor 80 is controlled by an antifuse programming signal FAMx that represents one bit of an address to be programmed into the bank of antifuses. The decoupling transistor 80 (and the pass transistor 76R) couple the control node 68R to ground only when the particular bit for the programmed address is high (i.e., FAMx is high). When the control node 68R is coupled to ground through the decoupling transistor 80, a high voltage can be applied as the CGND signal to the switchable node 50 during programming to program the antifuse 48R.

The third or antifuse sense leg includes an NMOS drop transistor 82R serially connected with the antifuse 48R between the control node 68R and the switchable node 50. The gate of the drop transistor 82R is directly coupled to the supply voltage $V_{CC}$ (or a higher voltage $V_{CCP}$) so that the drop transistor is always on. The drop transistor 82R therefore acts as a resistive element between the control node 68R and the antifuse 48R. Also, the drop transistor 82R limits the maximum voltage applied to the control node 68 during programming of the antifuse 48R to the supply voltage $V_{CC}$ minus the threshold voltage $V_T$ of the drop transistor. Consequently, the drop transistor 82R limits the drain-to-gate voltages of the transistors 76R, 78R and the source-to-gate voltage of the control transistor 66R to limit breakdown of the gate oxide.

When the antifuse 48R is unblown, the antifuse 48 forms an open circuit, and thus does not affect the voltage at node 68R and does not affect the latch 52. When the antifuse 48R is blown, however, the antifuse 48 has an impedance of approximately 5 kΩ. The blown antifuse 48R and drop transistor 82R form a conductive path between the control node 68R and the switchable node 50, allowing the switchable signal CGND to affect the voltage at control node. During address detection, the switchable signal CGND is coupled to ground, pulling down the voltage at the control node 68R, which causes the input of the inverter 62R to go low, tripping the latch 52R. The output signal FR then goes low, indicating that the antifuse 48R is blown. The output signal FR remains low even when the T(RAS) signal goes high, because the control transistor 66R, the drop transistor 82R and the blown antifuse 48R draw sufficient current to overpower the third transistor 60R. Thus, when the antifuse 48R is blown, the output signal FR goes low and stays low.

As noted above, for an eight bit address word, eight of such antifuse circuits 46 are required to address a redundant row and a redundant column. If a memory device employs eight redundant rows and eight redundant columns, sixty-four of such antifuse circuits 46 (for eight antifuse banks) are required. Sixty-four of such antifuse circuits 46 adds to the complexity of the memory device, which can increase the probability of defects, and possibly increase the number of manufacturing/processing steps.

Additionally, sixty-four of such antifuse circuits 46 consume substrate area on a die onto which the memory device is formed. Furthermore, certain transistors in each of the antifuse circuits 46 must be able to withstand high voltages during programming of the antifuses (e.g, transistors 60R, 60C, 78R, 78C, 80, 82R, and 82C). These high voltage transistors also require increased substrate area over typical transistors. Semiconductor circuit designers always desire to reduce substrate area to allow additional functionality to be added to a given device, allow for improved manufacturing tolerances, etc. Therefore, it would be desirable to reduce the number of antifuse circuits 46.

An additional shortcoming of the prior antifuse circuits relates to the lengthy time required to latch a signal in the row/column latch 52R, 52C. As noted above, the third transistor 60R (and 60C) has a high channel resistance. Since the row latch 52R unnecessarily has an inherent RC time constant required to latch a signal therein, an increased resistance caused by the transistor 60R therefore increases the RC time constant. As a result, the row latch 52R (and the column latch 52C) is slower to latch the output signal FR therein, than if the transistor 60R had a low channel resistance. As the speed of memory devices increases, there is increasing need for faster circuitry employed therein, including antifuse bank circuitry, which must be accessed during each read/write operation. The third transistor 60R provides a high resistance path from $V_{CC}$ to ground if the antifuse 48R (or 48C) is blown (i.e., the path through the transistors 56R, 60R, 66R, and 82R). Without such a high resistance path, high current flow through this path could damage the antifuse circuit 46. Consequently, the high resistance element cannot be removed from the path to speed up the response time of the antifuse circuit 46.

SUMMARY OF THE INVENTION

The present invention solves the problems of the prior art, and provides other benefits, by providing a single pull-up circuit that is shared between a redundant row antifuse cell, and a redundant column antifuse cell. The present invention also employs a single selection circuit that is shared between the two antifuse cells. A row selection signal supplied thereto selects the antifuse cell for the redundant row, while a column selection signal selects the antifuse cell for the redundant column. Consequently, the present invention can reduce the number of circuits required for each antifuse bank. As a result, the present invention is capable of reducing the total substrate area required for several fuse banks that address several redundant rows and columns.

Additionally, the present invention preferably employs a small channel width transistor, having a low resistance, within the latch circuit. As a result, the latch can quickly pull up a value when the antifuse cell is not blown, and quickly latch that value within the latch since the RC time constant of the latch is decreased. Rather than employing the relatively long T(RAS) signal to enable the latch, the present invention may employ a pulsed pull-up signal that has a very short duration. Since the pulsed pull-up signal has a short duration, the high voltage supply $V_{CC}$ is provided through the latch and blown antifuse cell to ground for only a short duration, thereby minimizing the possibility of such a low resistance current path damaging the circuitry. A transistor having a large channel resistance, however, is placed within the feedback path of the latch. Therefore, after the latch is set and the pulsed signal ends, the high resistance transistor provides a resistive current path from the $V_{CC}$ to ground if the antifuse cell is blown.

In a broad sense, the present invention preferably embodies a data storage and output circuit coupled to first and second voltage supply terminals. The data storage output circuit preferably stores at least 2 bits of information. The circuit includes first and second electronically programmable, read only memory cells, such as antifuses or fuses, where each read only memory cell is coupled at a first terminal to the first voltage supply. A shared selection circuit is coupled to the first and second read only memory cells and has an output terminal. This shared selection circuit provides first and second bits of information from the first and second read only memory cells to the output terminal upon receipt of first and second selection signals supplied thereto, respectively. An output circuit is coupled to the second voltage supply terminal and the output terminal of the shared selection circuit. The output circuit has a data output terminal. The output circuit provides the first and second bits of information for the first and second read only memory cells to the data output terminal.

DETAILED DESCRIPTION OF THE INVENTION

Figure 1:
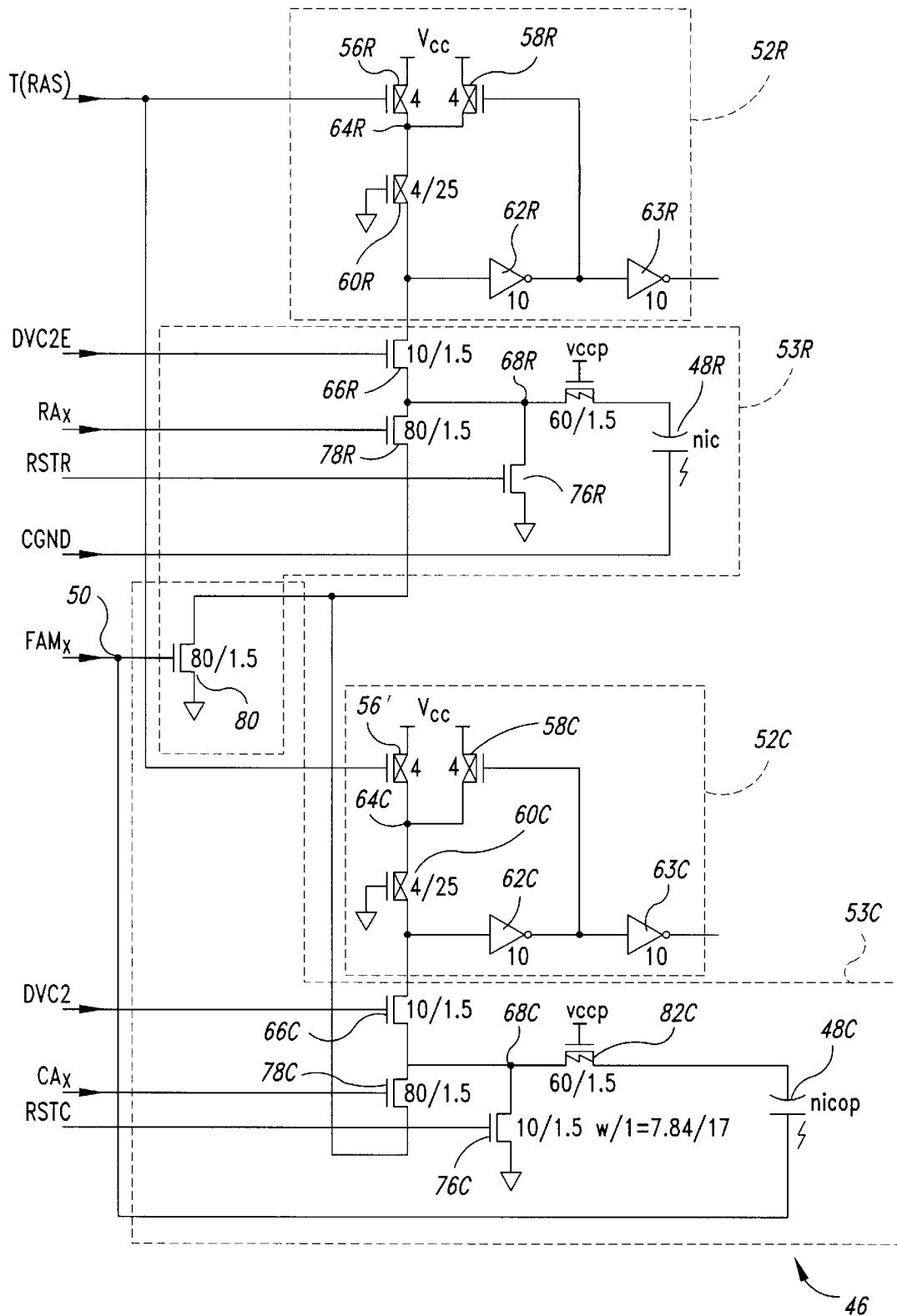
FIG. 1 is a schematic diagram of a prior art antifuse circuit having antifuse cells for redundant rows and columns.
Figure 2:
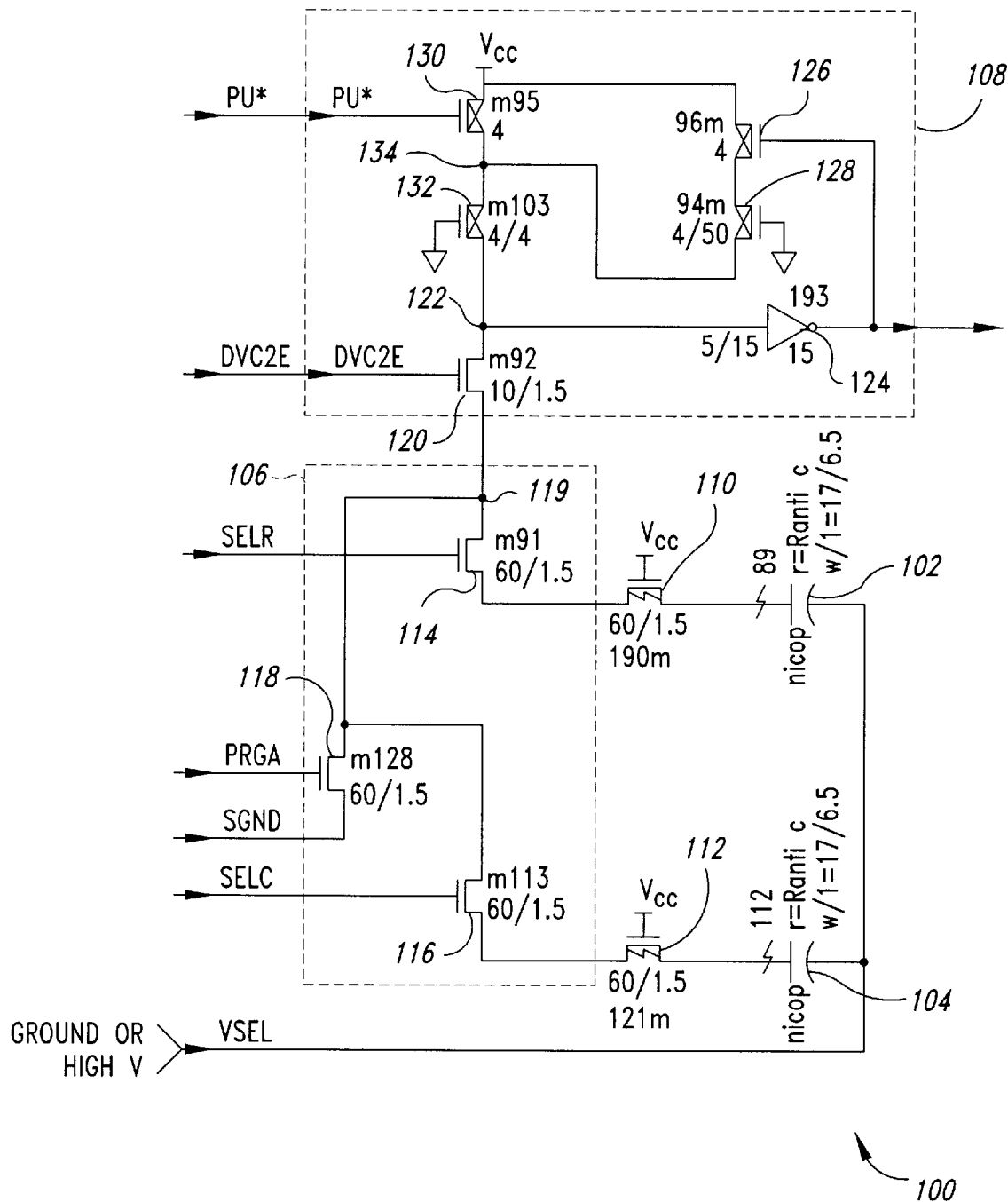
FIG. 2 is a schematic diagram of an antifuse circuit under the present invention.

Referring to FIG. 2, an antifuse circuit 100 of the present invention includes four principal portions: a row antifuse 102, a column antifuse 104, a selection circuit 106 for selecting either antifuse, and a pull-up and output latch 108 for latching a value stored in one of the antifuses. Each of the antifuses 102, 104 is coupled at one of its terminals to a switchable voltage supply signal $V_{SEL}$ (either ground or a high voltage, as described below). The other terminals of the antifuses 102, 104 are coupled to conventional high voltage transistors 110, 112 that can withstand a high voltage therethrough. Preferably, the transistors 110, 112 have large channel widths, relative to other transistors in the antifuse circuitry 100, so as to handle such high current and voltages (e.g., about sixty microns in width), and have gate regions offset, and distal from, the antifuses 102, 104. The transistors 110, 112 are preferably N-channel transistors having their gates coupled to a high voltage supply $V_{CC}$, so that they are always on to act as resistors, and so they limit the voltage applied to other transistors.

Row and column selection transistors 114, 116 have their drains coupled to the transistors 110, 112, and receive at their gates row and column selection signals SELR, SELC, all respectively. The sources of the row and column selection transistors 114, 116 are coupled at an intermediate node 119 to the drain of an enable transistor 120 in the pull-up and latch circuit 108. The row and column transistors 114, 116 are preferably N-channel transistors so that a high SELR or SELC signal selects the row or column antifuse 102, 104, respectively. For example, a high SELR signal turns on the row select transistor 114, thereby coupling the row antifuse 102 to the pull-up and latch circuit 108.

An N-channel programming transistor 118 is coupled between the intermediate node 119 and a terminal to receive a selectable ground signal SGND. When one of the antifuses 102, 104 is to be programmed, then its corresponding selection transistor 114, 116 is turned on, and the programming transistor 118 is coupled to ground (the SGND signal is equal to ground). The programming transistor 118 receives a programming signal PRGA at its gate. During programming, a high PRGA signal supplied to the gate of the programming transistor 118 couples the intermediate node 119 therethrough to ground. Thereafter, a high voltage signal is applied as the VSEL signal to the selected antifuse 102 or 104, blowing the dielectric formed therein, and providing a current path therethrough to ground (SGND).

The programming transistor 118, as well as the selection transistors 114, 116, preferably are high voltage N-channel transistors, such as transistors 110, 112, so that they can handle a large voltage during programming of the antifuses 102, 104. While the selection circuit 106 is generally described herein as employing row and column selection transistors 114, 116 and programming transistor 118, the selection circuit can employ one or more multiplexing circuits. Such multiplexing circuits, however, could employ a greater number of transistors than the transistors 114, 116 and 118, and therefore, can require a greater semiconductor surface area.

Referring to the pull-up and latch circuit 108, the enable transistor 120 is off during programming of the antifuses 102, 104, so that no current flows into the pull-up and latch circuit during programming. The enable transistor 120 is preferably an N-channel transistor having a channel-to-length ratio selected so that the transistor can easily overpower other transistors in the pull-up and latch circuitry 108, so as to operate as described below. During normal operation of the antifuse circuit 100, following programming of the antifuses 102, 104, the enable transistor 120 preferably receives a high voltage value of approximately one half $V_{CC}$, i.e., a signal DVC2E, to keep the transistor on. The enable transistor 120 is coupled between the intermediate node 119, and an input node 122 at an input of an inverter 124.

The latch in the pull-up and latch circuit 108 is formed by the inverter 124, together with serially coupled P-channel transistors 126, 128 and 132. The inverter 124 outputs an antifuse signal F, which indicates the state of the antifuse 102 or 104 to downstream correlation circuitry, described below. The output of the inverter 124 is also coupled to the gate of the transistor 126, whose source and drain are coupled to $V_{CC}$ and the transistor 128, respectively. The source of the transistor 132 is coupled to the drain of the transistor 128 at a node 134, while the drain of the transistor 132 is coupled to the input node 122. The gates of the transistors 128, 132 are coupled to ground thereby causing these transistors to act as resistors.

A control transistor 130 is coupled between the voltage supply $V_{CC}$, and the node 134 formed between the transistors 128, 132. A pull-up pulse PU* is provided to the gate of the control transistor 130 (preferably a P-channel device) so that when PU* is low, a high value is applied to the input node 122. As generally used herein, the symbol "*" indicates a signal having an active low value.

If one of the antifuses 102, 104 is blown, and its corresponding selection transistor 114, 116, is on, then the input node 122 is pulled therethrough to ground if DVC2E is high, thereby applying a low value to the input of the inverter 124. In response thereto, the inverter 124 outputs a high value, which turns off the transistor 126. Soon thereafter, the PU* signal returns to a high value, and in response thereto, the control transistor 130 similarly turns off. As a result, the input node 122 retains a low value, while the output of the inverter 124 retains a high value, thereby providing a high antifuse signal F that indicates that the antifuse is blown.

Figure 3:
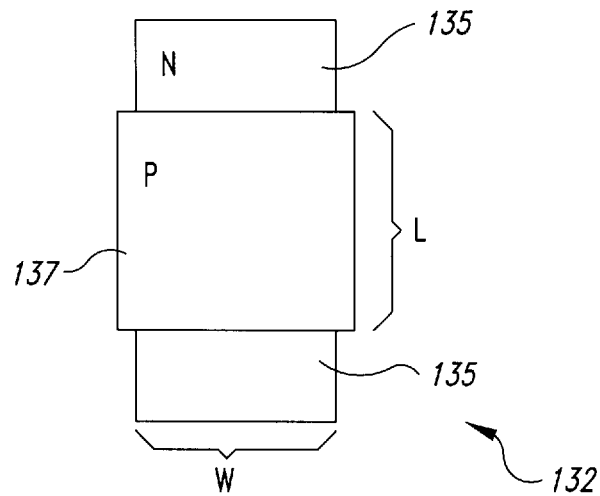
FIG. 3 is a schematic, top plan view of a P-channel transistor employed by the antifuse circuit of FIG. 2.

Importantly, the transistor 132 has a small channel length compared with transistors similarly positioned in prior antifuse circuits. The small channel length of the transistor 132 therefore provides a low channel resistance between $V_{CC}$ to the input node 122. In other words, as shown by the exemplary top plan schematic view of the transistor 132 in FIG. 3, a channel width W of the transistor can be approximately equal to its channel length L (about four microns). As is known, in a P-channel device, current flows from one of two N-type regions 135, through a P-type gate region 137 or channel, to the other N-type region when the gate receives a low voltage. As the channel width W increases, the channel resistance of the transistor similarly decreases, while as the channel length L increases, the channel resistance of the transistor similarly increases.

As a result, if the selected antifuse 102, 104 is not blown (i.e., is an open circuit), then the input node 122 can be rapidly pulled up through the transistor 132 to $V_{CC}$ since the transistor 132 has a low channel resistance. Consequently, the pull-up and latch circuit 108 can rapidly pull up the node 122 when the transistor 130 receives a low PU* signal, and thus the inverter 124 can rapidly output a low antifuse signal F, as opposed to prior antifuse circuits.

Conversely, the transistor 128 has a very high channel resistance due to a very long channel length L (about fifty microns). Therefore, if the transistor 128 were depicted beside the transistor 132 in FIG. 5, its channel length L would be about twelve times longer than that of the transistor 132. As a result, after the control transistor 130 is turned off (PU* returns to a high value), the high voltage $V_{CC}$ is applied through the transistors 126, 128 and 132 to the input node 122. If a high value was at the input node 122 when the control transistor 130 was on, the transistors 126, 128 and 132 continue to provide a high voltage path from $V_{CC}$ to the node after the transistor 130 turns off, to latch the value therein.

The high channel resistance of the transistor 128 is irrelevant during the initial latching time, because the transistor 128 is not in the pull-up path from the input node 122 to the high voltage supply $V_{CC}$. However, if one of the antifuses 102, 104 is blown, so that the input node 122 has a low voltage value (approximately equal to ground), then the transistor 128 provides a high resistance current path from the high voltage supply $V_{CC}$ to ground (through the blown antifuse), to thereby reduce the possibility of damaging the antifuse circuit 100.

As noted above, when the control transistor 130 is on, the transistor 132 provides a low resistance current path between $V_{CC}$ and ground, through the input node 122 and a blown antifuse 102, 104. As a result, the antifuse circuit 100 could be susceptible to high current damage (e.g., breakdown of oxide layers, etc.), when the control transistor 130 is on. To compensate, the pull-up pulse PU* applied to the gate of the control transistor 130 preferably has a short low voltage duration, e.g., about three nanoseconds. As a result, the high voltage supply $V_{CC}$ is applied to the low resistance current path, through transistors 130, 132, 120 and 114 and 110, or 116 and 112, for only a brief period of time. Thereafter, the PU* signal has a high voltage value, and the high voltage supply $V_{CC}$ is coupled through the high resistance transistor 128 while the latch is latched. In memory device, the PU* signal is preferably provided soon after RAS transitions to its active state, and preferably after row precharge (typically known as the $T_{RP}$ period).

Overall, for at least two reasons, the antifuse circuit 100 provides a reduced number of transistors for each pair of antifuses 102, 104. First, the antifuse circuit 100 employs only one pull-up and latch circuit 108 over prior antifuse circuits, thereby reducing in half the number of circuits required for such pull-up and latch circuitry. Second, the antifuse circuit 100 provides a reduced number of transistors in the antifuse and programming portion of the antifuse circuit (i.e., the circuitry to which the pull-up and latch circuitry 108 is coupled). Instead, the antifuse circuit 100 employs a selection circuit having two sections transistors 114, 116 that selects between two antifuses 102, 104, and a single programming transistor 118. Additionally, the pull-up and latch circuit 108 of the antifuse circuit operates more quickly than those of the prior art, by using the low channel resistance transistor 132, together with a short control pulse PU* that is applied to the control transistor 130. The high channel resistance transistor 128 is provided in the latch loop, which is only coupled to the input of the inverter 124 after the input node 122 has been rapidly pulled up (if the antifuse is intact).

Figure 4:
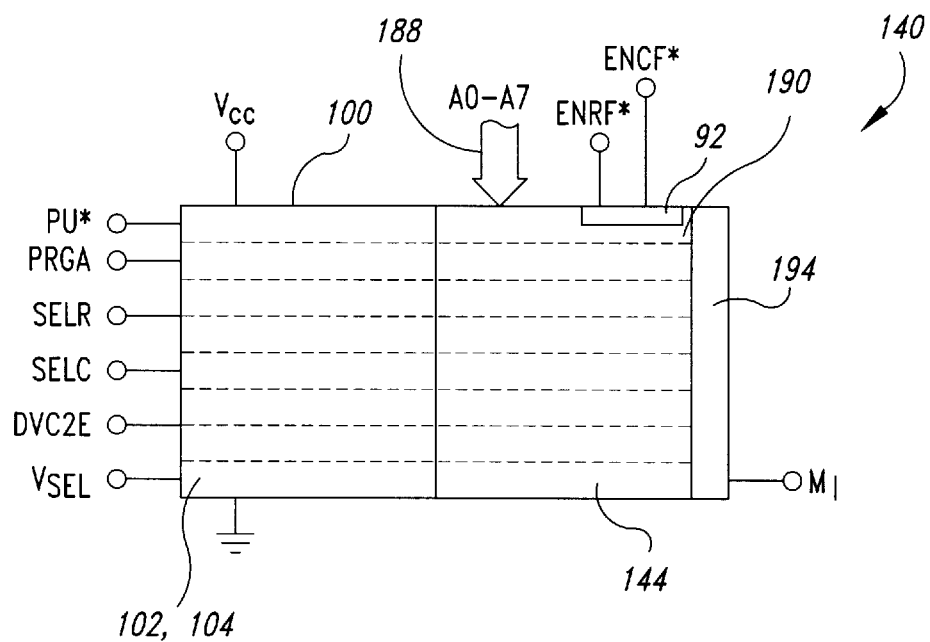
FIG. 4 is a block diagram of an antifuse address detection circuit employing the antifuse circuit of FIG. 2.

The antifuse circuit 100 can be employed with several other similar antifuse circuits to form an antifuse bank that, together with a correlation circuit addresses a redundant row and a redundant column in a memory device. Referring to FIG. 4, an antifuse address detection circuit 140 includes two principal portions, an antifuse bank and a correlation circuit 144. The antifuse bank is formed from eight parallel antifuse circuits 100, where each antifuse circuit corresponds to a bit of an address to be detected. If a memory device employing the address detection circuit 140 employs an eight bit address word, then at least eight of such antifuse circuits 100 per fuse bank must be employed.

The correlation circuit 144 can be of conventional construction, and can be formed from eight MUX banks and a combining or comparison circuit that typically employs exclusive OR gates (all not shown). All of the MUX banks receive row and column enable signals ENRF*, ENCF* indicating that either a row or a column address is enabled. In response to the enable signals ENCF, ENRF, each of the MUX banks outputs one of the output signals F from the antifuse circuit 100.

The eight output signals F from the eight antifuse circuits 100 are compared in the correlation circuit 144 to respective address bits A0–A7 from an address bus 188. If the pattern of address bits on the address bus 188 corresponds exactly to all the output signals F, the correlation circuit 144 produces a match signal M indicating the address has been matched. The match signal M would then enable a corresponding redundant row or column in a memory circuit depending upon whether ENRF* or ENCF* was low, respectively.

Figure 5:
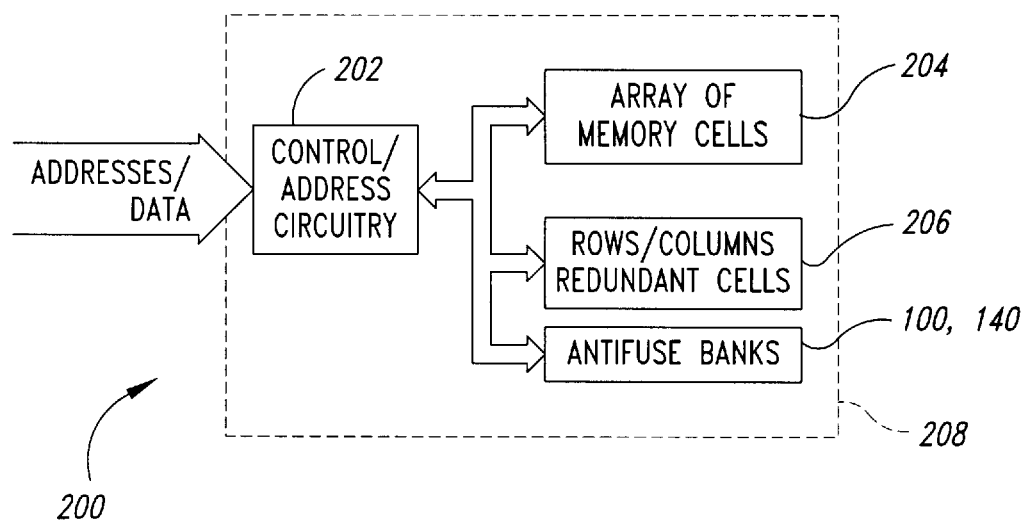
FIG. 5 is a block diagram of a semiconductor memory device employing the antifuse address detection circuit of FIG. 4.

Referring to FIG. 5, a memory circuit 200 is shown that can employ banks of the antifuse circuits 100 in an address detection circuit 140. The memory device 200 includes an array of memory cells 204, that can include one or more primary memory subarrays. Control/address circuitry 202 receives externally applied control, address and data signals, and in response thereto, accesses one or more memory cells in the array 204. The array 204, control/address circuitry 202, antifuse address detection circuit 140, and rows and columns of redundant memory cells 206 can be together formed on a die 208.

As is known, when the control/address circuitry 202 receives an external address, it buffers and latches the addresses, and provides them to row and column decoders. The row decoder decodes the address and applies it to the memory array 204 to enable a selected row in the array, while the column decoder, through sense amplifiers and input/output gating circuitry, enables one or more columns in the array. As explained above, if the control/address circuitry 202 addresses a defective row or column in the array 204, the antifuse address detection circuit 140 detects the external signal, and causes a row or column of redundant memory cells 206 to be accessed instead. For brevity, and because its operation is well-known to those skilled in the art, the general operation of the memory device 200 is not described in further detail herein.

Figure 6:
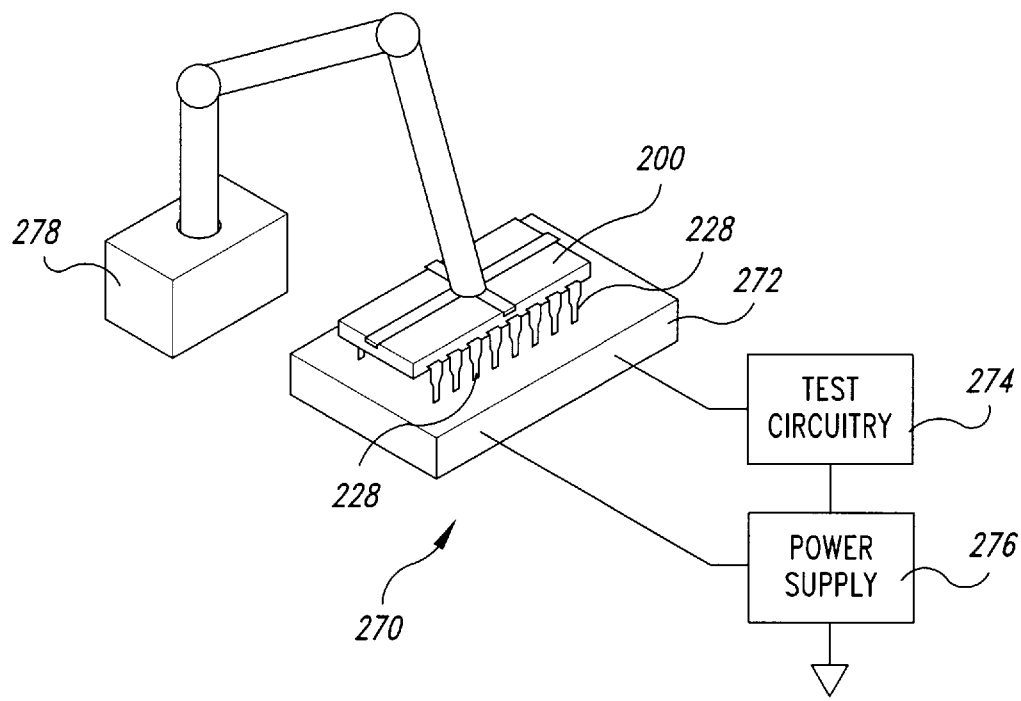
FIG. 6 is a partial isometric, partial block diagram of a testing station for testing a packaged semiconductor chip embodying the memory device of FIG. 5.

The antifuses 102, 104 in the antifuse circuit 100, are typically programmed or blown during testing of the device in which they are employed, such as the memory device 200. Referring to FIG. 6, a testing station 270 is shown for testing a packaged chip 200' that incorporates the memory device 200. The die 208 having the memory device 200 formed thereon, is preferably encapsulated by a protective material, such as epoxy or plastic, to form the package chip 200', where pins or leads 228 extend from the chip to provide terminals for the memory device. The testing station 270 has a socket 272 for releasably holding the chip 200' and providing electrical interconnection between the pins 228 and external test circuitry 274.

An external power supply 276 coupled to the socket 272 and the test circuitry 274 provides external power to the chip 100, such as $V_{CC}$, ground and the high voltage signal VSEL. Conventional automated pick and place machinery 278 can manipulate the chip and insert it into the test socket 272 for testing it to even more rapidly test the device 200 than when it is in die form. The test circuitry 274 of the test station 270 preferably includes microprocessor or microcontroller circuitry and memory (not shown) for performing conventional test routines. The test circuitry 274 also supplies the row and column selection signals SELR, SELC, and the programming signal PRGA to selectively program the antifuses 102, 104. Once the test circuitry 274 has located a defective memory cell in a primary row or column, the test circuitry programs a series of row or column antifuses 102, 104 in one of the antifuse banks 142 to the address for the defective row or column. The test circuitry 274 supplies the high voltage (about 10 volts) as the VSEL signal to blow one or more antifuses in the antifuse bank so as to permanently program the address therein. Other types of testing stations may, of course, also be used.

Figure 7:
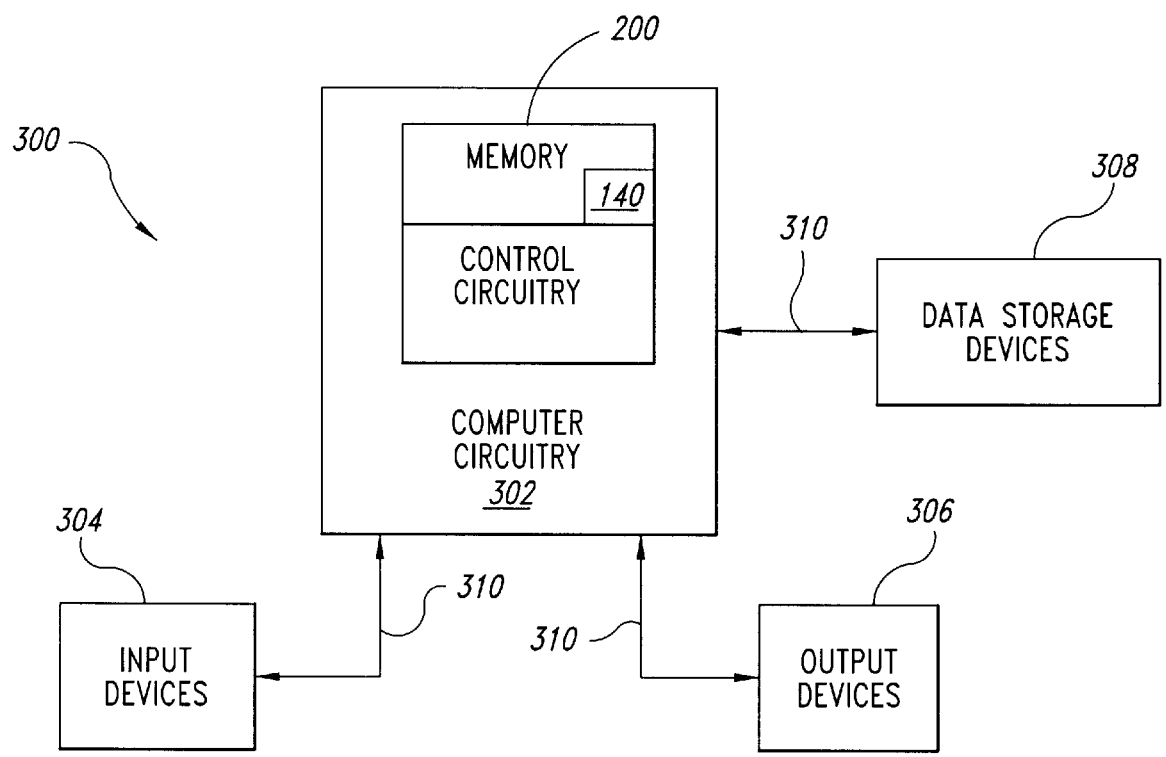
FIG. 7 is a block diagram of a computer system that incorporates the memory device of FIG. 5.

Since the antifuse device 100 provides improved performance, and increased die area, for the memory device 200, systems employing one or more of the memory devices 200 can similarly benefit from the present invention. Referring to FIG. 7, a computer system 300, employing the memory device 200, includes computer circuitry 302 for performing computer functions, such as executing software to perform desired calculations and tasks. The circuitry 302 typically contains a processor (not shown) and one or more of the memory devices 200.

One or more input devices 304, such as a keypad or a mouse, are coupled to the computer circuitry 302 and allow an operator to manually input data thereto. One or more output devices 306 are coupled to the computer circuitry 302 to display or otherwise output data generated by the computer circuitry 302. Examples of output devices include a printer and a video display unit. One or more data storage devices 308 are coupled to the computer circuitry to store data on or retrieve data from external storage media (not shown). Examples of storage devices 308 and storage media include drives that accept hard and floppy disks, tape cassettes, and compact-disk read only memories. The computer circuitry 302 also includes a bus 310 that couples the input devices 304, output devices 306 and data storage devices 308 to the computer circuitry 302.

Although specific embodiments of, and examples for, the present invention have described for purposes of illustration, various modifications can be made without departing from the spirit and scope of the invention, as is known by those skilled in the relevant art. For example, while the antifuse circuit 100 employs antifuse cells, it can, instead, employ fuses, with appropriate modifications made to the transistors (e.g., swapping P-channel for N-channel transistors and vice versa). Additionally, the antifuse circuit 100 can employ a self current limiting configuration, where the output of the inverter 124 is provided to the gate of the programming transistor 118, as is described in commonly assigned U.S. patent application Ser. No. 611,419, filed Mar. 5, 1996, entitled Self Current Limiting Antifuse Circuit, incorporated herein by reference. These and other changes can be made to the invention in light of the above detailed description. Accordingly, the invention is not limited by the disclosure, but instead its scope is to be determined entirely by reference to the following claims.

In general, unless specifically set forth to the contrary herein, the terms in the claims should not be construed to limit the invention to the specific embodiments disclosed in the specification and claims, but instead should be construed to include all systems and methods for selecting and outputting signals from antifuse or fuse circuits under the teachings disclosed herein. Terms such as electronically programmable read-only memory cell should generally be construed to include any programmable device, and terms such as programmable resistance element should be construed to include fuses, antifuses, etc. Likewise, terms such as selection circuit and output circuit should be construed to cover all elements that function to produce the ultimate operation of the present invention as disclosed in detail herein.

I claim:

1. A data storage and output circuit coupled to first and second voltage terminals and storing at least two bits of information, the circuit comprising:

first and second electronically programmable resistance cells each having first and second terminals, wherein the first terminals of the first and second programmable resistance cells are coupled at first terminals to the first voltage terminal;

a single shared selection circuit coupled to both of the first and second programmable resistance cells and having an output terminal, the shared single selection circuit providing either first or second bits of information from the first or second programmable resistance cells to the output terminal upon receipt of first or second selection signals supplied thereto, respectively; and a single output circuit coupled to the second voltage supply terminal and the output terminal of the single shared selection circuit and having a data output terminal, the single output circuit providing the first and second bits of information for the first and second programmable resistance cells to the data output terminal.

2. The circuit of claim 1 wherein the first and second programmable resistance cells are antifuses, wherein the single shared selection circuit includes first and second switch elements, the first switch element being coupled between a second terminal of the first antifuse cell and the output terminal, and receiving the first selection signal at a control terminal, and the second switch element being coupled between a second terminal of the second antifuse cell and the output terminal, and receiving the second selection signal at a control terminal.

3. The circuit of claim 1 wherein the single output circuit includes a latch circuit coupled between the output terminal of the single selection circuit and the data output terminal to latch the first or second bits of information to the data output terminal in response to the first or second selection signals applied to the single selection circuit, respectively.

4. The circuit of claim 1 wherein the single selection circuit is a multiplexing circuit.

5. An integrated circuit device coupled to first and second voltage supply terminals, comprising:

a plurality of rows and columns of circuit cells; and a plurality of electronically programmable resistance circuits, each programmable resistance circuit storing at least two bits of information of at least one address of at least one circuit cell in at least one of the plurality of rows and columns of circuit cells, each programmable resistance circuit comprising:

first and second programmable resistance cells each coupled to the first voltage supply terminal;

a single selection circuit coupled to both of the first and second programmable resistance cells and having an output terminal, the single selection circuit providing first and second bits of information from the first and second programmable resistance cells to the output terminal upon receipt of first and second selection signals supplied thereto, respectively; and a single output circuit coupled to the second voltage supply terminal and the output terminal of the single selection circuit and having a data output terminal, the single output circuit providing the first and second bits of information for the first and second programmable resistance cells to the data output terminal.

6. The integrated circuit of claim 5 wherein the first and second programmable resistance cells are antifuses, wherein the first antifuse cell provides one bit of an address of a defective memory cell in one of the plurality of rows of memory cells, and the second antifuse cell provides one bit of an address of a defective memory cell in one of the plurality of columns of memory cells.

7. The integrated circuit of claim 5 wherein the first and second programmable resistance cells are antifuse cells, wherein the single selection circuit includes first and second switch elements, the first switch element being coupled between a second terminal of the first antifuse cell and the output terminal, and receiving the first selection signal at a control terminal, and the second switch element being coupled between a second terminal of the second antifuse cell and the output terminal, and receiving the second selection signal at a control terminal.

8. The integrated circuit of claim 5 wherein the single output circuit includes a latch circuit coupled between the output terminal of the single selection circuit and the data output terminal to latch the first or second bits of information to the data output terminal in response to the first or second selection signals applied to the single selection circuit, respectively.

9. The integrated circuit of claim 5 wherein the single selection circuit is a multiplexing circuit.

10. A method of reading a value stored in first and second antifuse cells coupled to a first voltage potential, comprising the steps of:

selecting the first antifuse cell;

coupling the first antifuse cell to a second voltage potential for a brief time duration and changing a voltage valve at a sense node if the antifuse cell is intact;

maintaining the changed voltage value at the sense node following the step of coupling;

discontinuing the changed voltage value and selecting the second antifuse cell after the step of maintaining; and establishing a voltage at the sense node based on a state of the second antifuse cell.

11. The method of claim 10 wherein the step of coupling includes the step of providing a low resistance path between the first and second voltage potentials, and wherein the step of maintaining includes the step of providing a high resistance path between the first and second voltage potentials.

12. The method of claim 10, further comprising the step of providing a single shared selection circuit coupled to both the first and second antifuse cells.

13. The method of claim 10, further comprising the step of programming the first and second antifuse cells.

14. A data storage and output circuit coupled to first and second voltage terminals and storing at least two bits of information, the circuit comprising:

first and second electronically programmable resistance cells each having first and second terminals, wherein the first terminals of the first and second programmable resistance cells are coupled at first terminals to the first voltage terminal and storing first and second bits of information, respectively, and wherein each of the first and second programmable resistance cells have a bit output terminal; and a single output storage circuit coupled to the second voltage supply terminal and being selectively coupled to the bit output terminal of one of the first and second programmable resistance cells and having a data output terminal, wherein the single output storage circuit temporarily stores the one of the first and second bits of information from the respective first and second programmable resistance cells for output at the data output terminal based on whether the first or second programmable resistance cells are actively coupled to the output storage circuit.

15. The circuit of claim 14 wherein the output memory circuit includes a latch circuit coupled between the bit output terminals of the first and second programmable resistance cells and the data output terminal to latch the first or second bits of information to the data output terminal in response to first or second selection signals, respectively.

16. The circuit of claim 14, further comprising a shared selection circuit having first and second switch elements, the first switch element being coupled between the bit output terminal of the first antifuse cell and the output storage circuit, and receiving a first selection signal at a control terminal, and the second switch element being coupled between the bit output terminal of the second antifuse cell and the output storage circuit, and receiving a second selection signal at a control terminal.

17. The circuit of claim 14 wherein the single output storage circuit includes a low resistance path between the second voltage supply terminal and the bit output terminals of the first and second programmable resistance cells, and wherein the single output storage circuit is only coupled to the bit output terminals for a duration substantially shorter than a duration that the first or second bits of information are stored in the single output storage circuit.

\* \* \* \* \*

UNITED STATES PATENT AND TRADEMARK OFFICE
CERTIFICATE OF CORRECTION

PATENT NO. : 5,875,144  
DATED : 2/23/99  
INVENTOR(S) : Zheng

Page 1 of 3

It is certified that error appears in the above-indentified patent and that said Letters Patent is hereby corrected as shown below:

On the title page, insert item [56],

U. S. PATENT DOCUMENTS

| EXAMINER INITIAL | | PATENT NUMBER | | | | | | ISSUE DATE | PATENTEE | CLASS | SUBCLASS | FILING DATE IF APPROPRIATE |
|---|---|---|---|---|---|---|---|---|---|---|---|---|
| | | 4 | 4 | 5 | 9 | 6 | 6 | 0 | 07/10/84 | Bellay, et al | | | |
| | | 4 | 8 | 0 | 1 | 9 | 9 | 2 | 01/31/89 | Golubic | | | |
| | | 4 | 8 | 4 | 3 | 1 | 8 | 8 | 06/27/89 | Patterson, et al | | | |
| | | 4 | 9 | 5 | 8 | 0 | 8 | 8 | 09/18/90 | Farah-Bakhsh, et al | | | |
| | | 5 | 0 | 9 | 7 | 1 | 5 | 7 | 3/17/92 | Jaffe, et al. | | | |
| | | 5 | 1 | 6 | 4 | 6 | 1 | 9 | 11/17/92 | Luebs | | | |
| | | 5 | 2 | 1 | 6 | 2 | 9 | 7 | 06/01/93 | Proebsting | | | |
| | | 5 | 2 | 4 | 8 | 9 | 4 | 6 | 09/28/93 | Murakami, et al | | | |
| | | 5 | 2 | 7 | 8 | 4 | 6 | 0 | 01/11/94 | Casper | | | |
| | | 5 | 2 | 9 | 5 | 1 | 0 | 2 | 03/15/94 | McClure | | | |
| | | 5 | 3 | 1 | 1 | 0 | 8 | 1 | 05/10/94 | Donaldson, et al | | | |
| | | 5 | 3 | 6 | 1 | 0 | 0 | 2 | 11/01/94 | Casper | | | |
| | | 5 | 3 | 8 | 9 | 8 | 3 | 4 | 02/14/95 | Kinugasa, et al. | | | |
| | | 5 | 4 | 2 | 2 | 5 | 2 | 9 | 06/06/95 | Lee | | | |
| | | 5 | 4 | 3 | 2 | 8 | 2 | 3 | 07/11/95 | Gasbarro, et al | | | |
| | | 5 | 4 | 5 | 1 | 8 | 9 | 8 | 09/19/95 | Johnson | | | |
| | | 5 | 4 | 5 | 5 | 7 | 9 | 8 | 10/03/95 | McClure | | | |
| | | 5 | 4 | 6 | 5 | 0 | 6 | 0 | 11/07/95 | Pelella | | | |
| | | 5 | 4 | 8 | 8 | 3 | 2 | 1 | 01/30/96 | Johnson | | | |
| | | 5 | 4 | 9 | 1 | 6 | 6 | 4 | 02/13/96 | Phelan | | | |

UNITED STATES PATENT AND TRADEMARK OFFICE
CERTIFICATE OF CORRECTION

PATENT NO.  : 5,875,144
DATED       : 2/23/99
INVENTOR(S) : Zheng

Page 2 of 3

It is certified that error appears in the above-indentified patent and that said Letters Patent is hereby corrected as shown below:

U. S. PATENT DOCUMENTS

| EXAMINER INITIAL | | PATENT NUMBER | | | | | | | ISSUE DATE | PATENTEE | CLASS | SUBCLASS | FILING DATE IF APPROPRIATE |
|---|---|---|---|---|---|---|---|---|---|---|---|---|---|
| | | 5 | 5 | 2 | 8 | 5 | 3 | 9 | 06/18/96 | Ong, et al. | | | |
| | | 5 | 5 | 3 | 9 | 3 | 3 | 3 | 07/23/96 | Cao, et al | | | |
| | | 5 | 5 | 7 | 0 | 0 | 4 | 2 | 10/29/96 | Ma | | | |
| | | 5 | 5 | 7 | 4 | 7 | 2 | 9 | 11/12/96 | Kinoshita, et al | | | |
| | | 5 | 5 | 7 | 7 | 0 | 5 | 0 | 11/19/96 | Bair, et al. | | | |
| | | 5 | 5 | 7 | 8 | 9 | 4 | 1 | 11/26/96 | Sher, et al. | | | |
| | | 5 | 6 | 0 | 2 | 7 | 8 | 6 | 02/11/97 | Pascucci, et al | | | |
| | | 5 | 6 | 1 | 7 | 3 | 6 | 5 | 04/01/97 | Horiguchi, et al | | | |
| | | 5 | 6 | 2 | 1 | 3 | 4 | 0 | 04/15/97 | Lee | | | |
| | | 5 | 6 | 2 | 5 | 8 | 0 | 5 | 04/29/97 | Fenwick, et al. | | | |
| | | 5 | 6 | 5 | 9 | 5 | 0 | 9 | 08/19/97 | Golla | | | |
| | | 5 | 6 | 6 | 3 | 9 | 1 | 5 | 09/02/97 | Mobley | | | |
| | | 5 | 6 | 6 | 6 | 0 | 6 | 7 | 09/09/97 | Sher, et al. | | | |
| | | 5 | 6 | 9 | 1 | 9 | 4 | 5 | 11/25/97 | Liou, et al. | | | |
| | | 5 | 7 | 0 | 6 | 2 | 9 | 2 | 01/06/98 | Merritt | | | |
| | | 5 | 7 | 5 | 7 | 7 | 1 | 1 | 05/26/98 | Nakaoka, et al. | | | |
| | | 5 | 7 | 8 | 1 | 4 | 8 | 6 | 07/14/98 | Merritt | | | |
| | | 5 | 7 | 9 | 0 | 4 | 6 | 2 | 08/04/98 | McClure | | | |
| | | 5 | 8 | 0 | 9 | 2 | 2 | 5 | 09/15/98 | Ohsawa, et al. | | | |
| | | 5 | 8 | 9 | 8 | 2 | 8 | 7 | 04/27/99 | Roberti, et al. | | | |

UNITED STATES PATENT AND TRADEMARK OFFICE
CERTIFICATE OF CORRECTION

PATENT NO. : 5,875,144
DATED : 2/23/99
INVENTOR(S) : Zheng

It is certified that error appears in the above-indentified patent and that said Letters Patent is hereby corrected as shown below:

U. S. PATENT DOCUMENTS

| EXAMINER INITIAL | PATENT NUMBER | ISSUE DATE | PATENTEE | CLASS | SUBCLASS | FILING DATE IF APPROPRIATE |
|---|---|---|---|---|---|---|
| | 5 9 1 5 1 0 5 | 06/22/99 | Farmwald, et al. | | | |
| | | | | | | |
| | | | | | | |
| | | | | | | |

OTHER PRIOR ART (Including Author, Title, Date, Pertinent Pages, Etc.)

Chapman, J. et al., "A Low-Cost High-Performance CMOS Timing Vernier for ATE", IEEE International Test Conference, Paper 21.2, 1995, pp. 459-468

"Draft Standard for a High-Speed Memory Interface (SyncLink)", Microprocessor and Microcomputer Standards Subcommittee of the IEEE Computer Society, Copyright 1996 by the Institute of Electrical and Electronics Engineers, Inc., New York, NY, pp. 1-56

Signed and Sealed this

Twenty-third Day of November, 1999

Attest:

Q. TODD DICKINSON

*Attesting Officer*  *Acting Commissioner of Patents and Trademarks*

UNITED STATES PATENT AND TRADEMARK OFFICE
CERTIFICATE OF CORRECTION

PATENT NO.    : 5,875,144
DATED         : February 23, 1999
INVENTOR(S)   : Zheng It is certified that error appears in the above-identified patent and that said Letters Patent is hereby corrected as shown below:

<u>Title page,</u>
Insert item [56],

-- FOREIGN PATENT DOCUMENTS
WO  95/22064   8/17/1995     PCT(W/English Abstract)

OTHER PUBLICATIONS
Descriptive literature entitled, "400MHz SLDRAM, 4M X 16
SLDRAM Pipelined, Eight Bank, 2.5 V Operation,"
SLDROM Consortium Advance Sheet, published throughout the
United States, pp. 1-22. --

Signed and Sealed this

Seventeenth Day of September, 2002

Attest:

Attesting Officer

JAMES E. ROGAN
Director of the United States Patent and Trademark Office

UNITED STATES PATENT AND TRADEMARK OFFICE
CERTIFICATE OF CORRECTION

PATENT NO. : 5,875,144
DATED : February 23, 1999
INVENTOR(S) : Zheng

It is certified that error appears in the above-identified patent and that said Letters Patent is hereby corrected as shown below:

Title page,
Item [56], References Cited, FOREIGN PATENT DOCUMENTS, please add the follows:
-- FOREIGN PATENT DOCUMENTS
WO    95/22064    8/17/1995    PCT(W/English Abstract)

OTHER PUBLICATIONS
Descriptive literature entitled, "400MHz SLDRAM, 4M X 16 SLDRAM Pipelined, Eight Bank, 2.5 V Operation," SLDROM Consortium Advance Sheet, published throughout the United States, pp.1-22. --

Signed and Sealed this

Eighteenth Day of January, 2005

JON W. DUDAS
*Director of the United States Patent and Trademark Office*